US006974088B2

(12) United States Patent
Albert et al.

(10) Patent No.: US 6,974,088 B2
(45) Date of Patent: Dec. 13, 2005

(54) ACTUATOR WITH A DUCT OPENING SEALED DURING EXTRUSION COATING AGAINST THE INGRESS OF PLASTIC

(75) Inventors: Roland Albert, Regensburg (DE); Johann Heigl, Bernhardswald (DE); Markus Mohr, Roth (DE); Klaus Niesslbeck, Neumarkt (DE)

(73) Assignee: Siemens Aktiengesellschaft, Munich (DE)

( * ) Notice: Subject to any disclaimer, the term of this patent is extended or adjusted under 35 U.S.C. 154(b) by 190 days.

(21) Appl. No.: 10/692,392

(22) Filed: Oct. 23, 2003

(65) Prior Publication Data

US 2004/0108481 A1 Jun. 10, 2004

(30) Foreign Application Priority Data

Oct. 28, 2002 (DE) ................................ 102 50 202

(51) Int. Cl.⁷ ..................... F02M 47/02; F02M 59/00; B05B 1/30
(52) U.S. Cl. .................. 239/88; 239/533.1; 239/533.2; 239/533.12; 239/585.3
(58) Field of Search ................. 239/88–93, 533.1, 239/533.2, 533.12, 533.14, 585.1–585.5, 239/596; 251/129.15, 129.21, 127

(56) References Cited

U.S. PATENT DOCUMENTS

| 5,881,807 | A | * | 3/1999 | B.o slashed.e et al. | ..... 166/100 |
| 6,126,094 | A | * | 10/2000 | Ricco | ....................... 239/585.1 |
| 6,717,103 | B2 | * | 4/2004 | Ellenkamp | ............. 219/121.71 |

FOREIGN PATENT DOCUMENTS

| DE | 198 18 068 A1 | 10/1999 | ............ H02N 2/04 |
| DE | 199 40 347 A1 | 3/2001 | ............ H05K 5/06 |

* cited by examiner

*Primary Examiner*—Davis Hwu
(74) *Attorney, Agent, or Firm*—Baker Botts L.L.P.

(57) ABSTRACT

An actuator with a top plate comprises at least one duct opening for a respective electric contact pin. A contact stud carrier with a contact stud is placed over the contact pin. To prevent the possible ingress of plastic into the duct opening between a gap (s) between the contact stud carrier and the top plate during extrusion coating of the actuator or its top plate, according to the invention it is proposed that a sealing washer be located onto the open side of the duct opening of the top plate to provide a hermetic seal. As a result, the contact stud carrier can advantageously always be arranged independently of the thickness of the sealing washer such that a specified actuator length (L) can be precisely maintained. This simplifies the production process for the actuator and reduces its production costs.

20 Claims, 3 Drawing Sheets

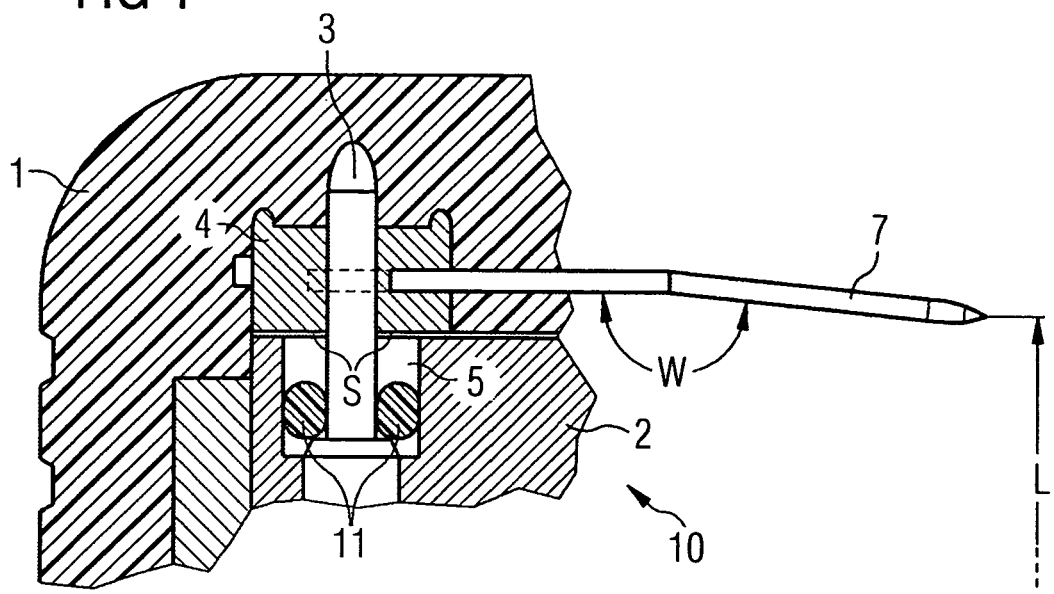
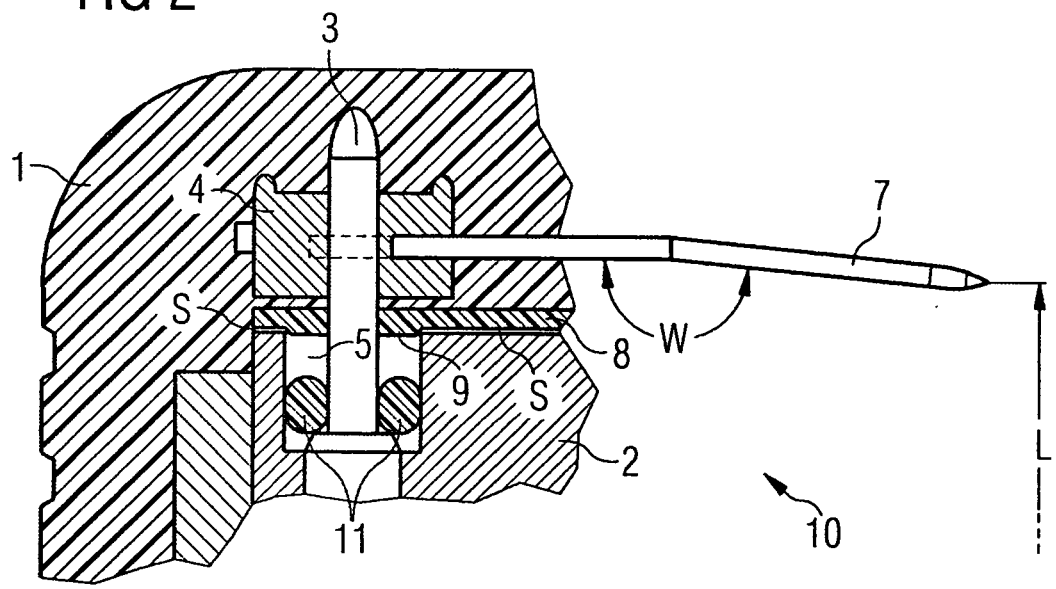

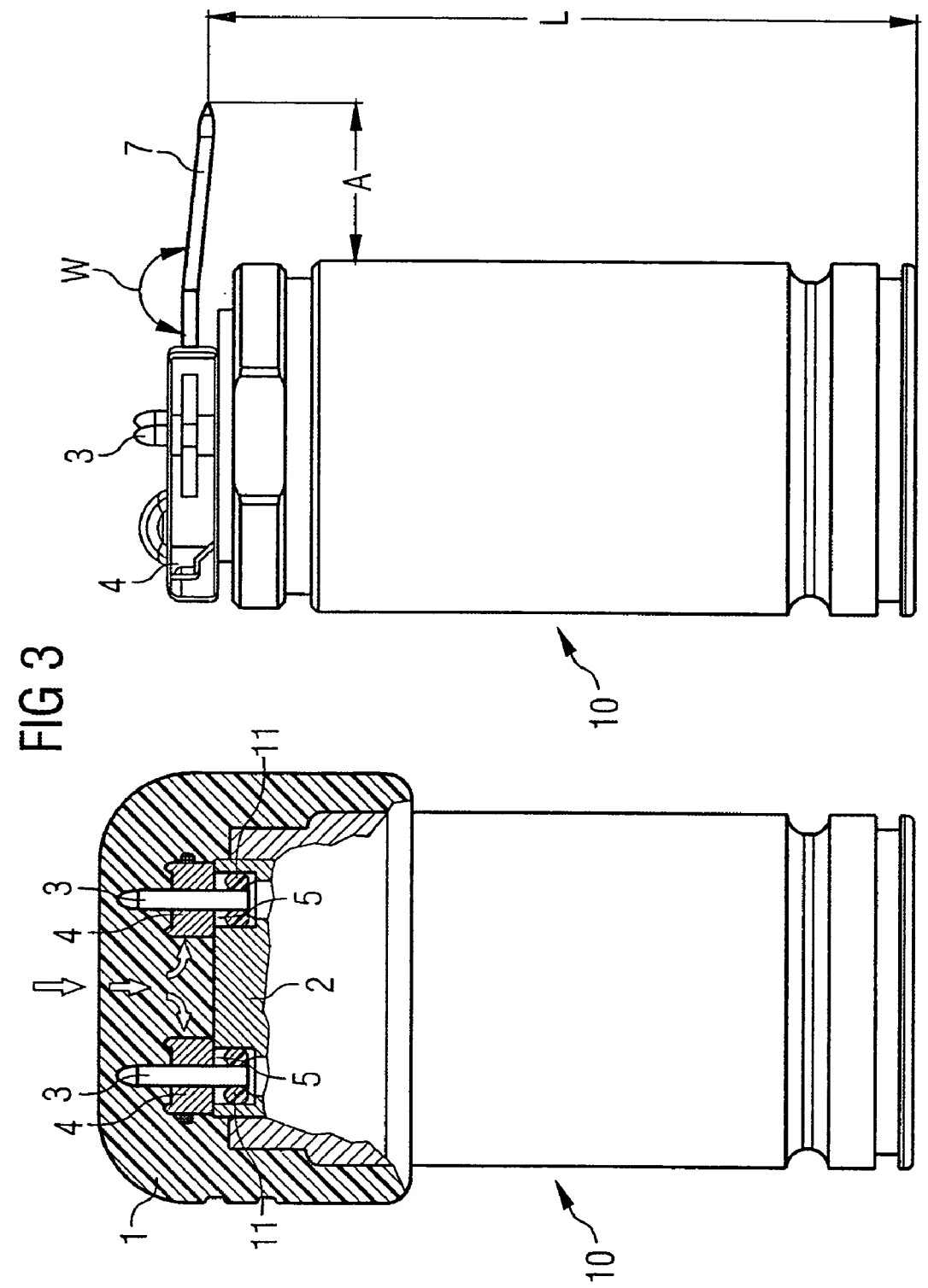

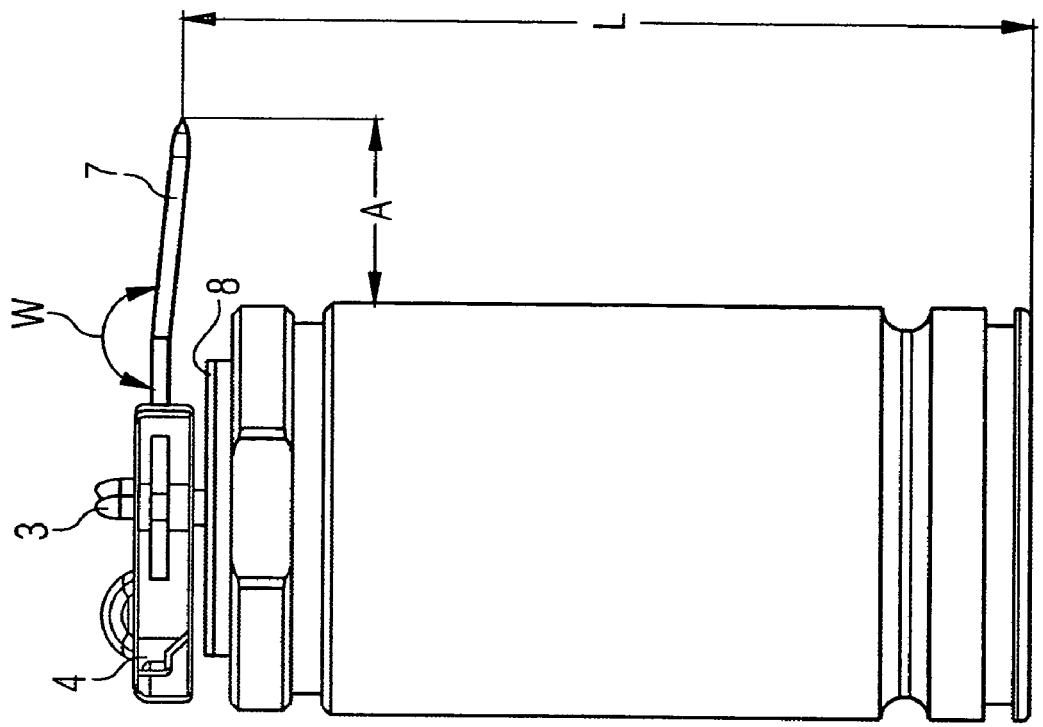

ACTUATOR WITH A DUCT OPENING SEALED DURING EXTRUSION COATING AGAINST THE INGRESS OF PLASTIC

PRIORITY

This application claims foreign priority of the German application DE 10250202.1 filed on Oct. 28, 2002.

TECHNICAL FIELD

The invention relates to an actuator with a duct opening.

BACKGROUND OF THE INVENTION

An actuator with a top plate having at least one duct opening, in particular for an electrical contact pin, is known from DE 199 40 347 A1. A plastic cover contains contact pins.

The design of an actuator for injection valves is known from DE 198 18 068 A1. There, a piezostack is bounded at its ends by a top plate and a base plate and surrounded by a cylindrical tube spring which is welded at its end openings to in each case the base plate or top plate.

SUMMARY OF THE INVENTION

The object of the present application is to securely seal the open side of a duct opening against the ingress of plastic when a component is being extrusion-coated with plastic and at the same time to maintain a specified component length. This object can be achieved by an actuator, in particular for a fuel injection valve, comprising a top plate having at least one duct opening in particular for a respective electric contact pin, onto which a contact stud carrier with a contact stud can be located, wherein the duct opening is protected on its open side against the ingress of plastic during extrusion coating, and a sealing washer attached to the open side of the duct opening, wherein the sealing washer is embodied to cover the top side of the top plate in an overlapping manner at least in the area of the duct opening, thereby hermetically sealing the duct opening.

The sealing washer can be embodied in the area of the duct opening with a thickening protruding at least partially into the duct opening. The sealing washer can be fixed into position on the top side of the top plate and can preferably be secured there by means of an adhesive. A sprung element can be provided which presses the sealing washer against the open side of the duct opening. An actuator length can be specified between the contact stud of the contact stud carrier and a reference edge of the actuator independently of the thickness of the sealing washer. The sealing washer may comprise an insulating plastic material. The sealing washer can be embodied at least partially from metal. The actuator may have a piezoelectric element.

The object can furthermore be achieved by a method of manufacturing an actuator for a fuel injector in an internal combustion engine comprising the steps of:

providing the actuator having a top plate and at least one duct opening for a respective electric contact pin, attaching a sealing washer to the open side of the duct opening, wherein the sealing washer is embodied to cover the top side of the top plate in an overlapping manner at least in the area of the duct opening, thereby hermetically sealing the duct opening, placing a contact stud carrier with a contact stud onto a top plate of the actuator, thereby protecting the duct opening on its open side against the ingress of plastic during extrusion coating.

The method may further comprise the step of fixing the sealing washer into position on the top side of the top plate and preferably securing the sealing washer there by means of an adhesive. The method may also comprise the step of providing a sprung element which presses the sealing washer against the open side of the duct opening. The method may also comprise the step of specifying an actuator length between the contact stud of the contact stud carrier and a reference edge of the actuator independently of the thickness of the sealing washer. Finally, the method may further comprise the step of extrusion coating the actuator.

An actuator with a piezoelectric element (stack) contains duct openings located in the top plate for in each case one electric contact pin, with in each case one contact stud carrier being covered before the component or top plate is extrusion-coated with plastic. The contact stud carrier therefore not only carries one or more contact studs for further conducting the electric current but must also perform the sealing function for the duct opening.

It has, however, been demonstrated in practice that in order to maintain the mounting dimension L a small gap can form and a small amount of plastic can creep under the contact stud carrier. This plastic may in certain circumstances cause damage to the actuator. It is necessary to maintain a dimensional accuracy with very close tolerances for the individual component lengths. If the length tolerances accumulate unfavorably, the mounting dimension L can only be corrected with difficulty by subsequently bending the contact studs. In the worst case such a component will be classed as a reject even if it fulfills its mechanical or electrical functions.

The component (actuator) according to the invention with at least one duct opening in its top plate in which in particular a contact pin is located, has by contrast the advantage that the sealing washer provides reliable sealing of the duct opening against the ingress of plastic during extrusion coating. Failure of the seal owing in particular to the formation of a gap or slight lifting of the sealing washer from the top plate is reliably avoided as the top side of the top plate is covered in an overlapping manner in the area of the duct opening. It further appears especially advantageous that the sealing washer has no effect on a specified component length so that the dimensions specified for the component length with close tolerances can be precisely maintained in all circumstances.

It is seen as especially advantageous that the sealing washer has a thickening in the area of the duct opening. This thickening provides a longer sealing length so that gaps cannot form even when injection pressure is high.

To ensure secure fixing of the sealing washer on the top plate, this can preferably be fixed into position with a suitable adhesive. The undesired formation of gaps will thereby be avoided even more reliably.

The object can also be favorably alternatively achieved by pressing the sealing washer against the open side of the duct opening 5 with a sprung element prior to extrusion coating. This process can occasionally be carried out faster and more easily in serial production, in particular when the individual parts are assembled automatically. Relatively long drying times for the adhesive are also occasionally advantageously eliminated.

Thanks to the duct opening's being sealed with the sealing washer the contact stud carrier no longer has to be located directly on the top plate. It can therefore be mounted independently of the thickness of the sealing washer via separate spacers, for example, thereby precisely ensuring the specified component length.

Manufacturing the sealing washer from an insulating material such as plastic is also regarded as particularly advantageous. This has the advantage of simultaneously providing insulation against flashovers in particular in the case of an electric contact pin on which, for instance, high voltages may also occur.

A favorable alternative achievement of the object is also seen in a sealing washer made of metal. Metals such as copper and the like appear especially advantageous in the presence of high mechanical loads.

Using the sealing washer in particular in the case of a component with a piezoelectric element or actuator has the advantage that the contact pins can be of very robust design. This is necessary especially in the case of an injector for injecting fuel into an internal combustion engine in which the actuator is installed. As high fuel pressures occur on the component, the contact pin in the duct opening has to be particularly well sealed so that no fuel can penetrate into the component.

There is a preferred use of the component in connection with gasoline or diesel injection.

BRIEF DESCRIPTION OF THE DRAWINGS

An exemplary embodiment of the invention is shown in the drawing and is explained in greater detail in the description that follows.

FIG. 1 shows a duct opening seal in schematic form,

FIG. 2 shows an exemplary embodiment of a seal according to the invention, the two FIG. 3 show a known component with a piezoelectric actuator where the duct opening has been sealed according to the known prior art, and the two FIG. 4 show the seal according to the invention on the previously cited component with the actuator.

DETAILED DESCRIPTION OF THE PREFERRED EMBODIMENTS

To make the invention more readily comprehensible, FIG. 1 first shows a section of a component 10 with a duct opening 5 in a top plate 2 through which a contact pin 3 is ducted. The contact pin 3 is sealed within the duct opening 5 against the ingress of fuel by means of an O-ring 11. A contact stud carrier 4 is mounted on the contact pin 3 in such a way as to seal the duct opening 5 when the top plate 2 or the component 10 is extrusion-coated with plastic 1 (dashed line). The contact stud carrier 4 has corresponding contact studs 7 which protrude somewhat and are bent at a specified angle W. The top surface of the component 10 is in this case designated as top plate 2.

The component 10 has in this case a piezoelectric element, also referred to as an actuator, which can be electrically powered or controlled via two contact pins 3. The actuator 10 is mounted in an injector which, for example, controls the volume of fuel, such as gasoline or diesel, injected into an internal combustion engine.

The component 10 is generally extrusion-coated with plastic 1 during manufacture to protect it against mechanical damage. A gap s through which the plastic 1 can penetrate can form during this process at the locations identified in FIG. 1 by two arrows. Ingress of the plastic will then cause lifting of the contact stud carrier 4 so that a specified design length L, measured for example between the tip of the contact stud 7 and the base of the actuator 10, will be somewhat increased to an undesirable extent. The possibilities for correcting the design length L, for example by altering the angle W, are limited after extrusion coating as the above length of the contact stud 7 also changes to an undesirable extent with the angle W.

FIG. 2 shows the component 10 from FIG. 1 with the duct opening 5 being sealed in an overlapping manner at its open side by means of a sealing washer 8. By means of an adhesive or the application of pressure from a sprung element (not shown in FIG. 2), the sealing washer 8 can be fixed into position such that no gap s can form during extrusion coating and hence no plastic 1 can penetrate into the duct opening 5. In the area of the duct opening 5 the sealing washer 8 can also have a thickening 9 preferably protruding into the duct opening 5. Simple adjustment of the sealing washer 8 is thereby facilitated and the sealing area increased. The sealing washer 8 is produced from an insulating plastic material, for example, or from a metal such as copper and the like.

The contact stud carrier 4 is located independently of the thickness of the sealing washer 8 onto the contact pin 3 with a specified clearance and fixed into position there. The specified component length L can then be set independently of the thickness of the sealing washer 8. The individual tolerances can have no effect on the component length L. It is also advantageous that subsequent bending of the contact studs 7 is unnecessary.

There is a further advantage in the fact that the force of the injected material 1 impacting on the sealing washer 8 during extrusion coating presses this washer even more firmly against the top plate 2, thereby preventing lifting of the top plate 2.

The two FIG. 3 show the previously mentioned actuator 10 as a component, in each case in side view and rotated approximately through 90°. These components correspond to the design known per se. The plastic extrusion coating has been opened up in the left-hand FIG. 3 so that, similarly to the way described previously in connection with FIG. 1, it is possible to see the top plate 2 with two duct openings 5 in which the two contact pins 3 are located. The purpose of the thick arrows is to identify the direction of flow of the injected plastic 1 and a possible gap formation between the top plate 2 and the contact stud carrier 4 associated with this.

The right-hand FIG. 3 has been rotated approximately through 90° and shows in particular the contact studs 7 with the clearance length A and the component length L. The plastic extrusion coating 1 has been omitted here for reasons of clarity.

The two FIG. 4 show the corresponding embodiment according to the invention of the actuator 10. As can be seen from the left-hand FIG. 4, the two duct openings 5 have been covered or sealed in an overlapping manner with the sealing washer 8. The sealing washer 8 again shows a thickening 9 protruding into the duct opening 5 in this exemplary embodiment. The contact stud carrier 4 has been placed over the contact pins 3 with a certain clearance and arranged so that the specified component length L can be maintained. It must be mentioned for the sake of completeness that identical reference numbers have the same significance in all the figures.

The right-hand FIG. 4 shows the actuator 10 again rotated approximately through 90°. It can clearly be seen here how the component length L can be set independently of the thickness of the sealing washer 8. The plastic extrusion coating 1 has again been omitted here for reasons of clarity.

The invention is not restricted to the exemplary embodiment. According to the invention the sealing washer 8 can be used for any components 10 where a duct opening 5 has to be sealed.

We claim:

1. An actuator, in particular for a fuel injection valve, comprising:
    a top plate having at least one duct opening in particular for a respective electric contact pin, onto which a contact stud carrier with a contact stud can be located, wherein the duct opening is protected on its open side against the ingress of plastic during extrusion coating,
    a sealing washer attached to the open side of the duct opening, wherein the sealing washer is embodied to cover the top side of the top plate in an overlapping manner at least in the area of the duct opening, thereby hermetically sealing the duct opening.

2. The actuator according to claim 1, wherein the sealing washer is embodied in the area of the duct opening with a thickening protruding at least partially into the duct opening.

3. The actuator according to claim 1, wherein the sealing washer can be fixed into position on the top side of the top plate and can preferably be secured there by means of an adhesive.

4. The actuator according to claim 1, wherein a sprung element is provided which presses the sealing washer against the open side of the duct opening.

5. The actuator according to claim 1, wherein an actuator length can be specified between the contact stud of the contact stud carrier and a reference edge of the actuator independently of the thickness of the sealing washer.

6. The actuator according to claim 1, wherein the sealing washer comprises an insulating plastic material.

7. The actuator according to claim 1, wherein the sealing washer is embodied at least partially from metal.

8. The actuator according to claim 1, wherein the actuator has a piezoelectric element.

9. Fuel injector for use in an internal combustion engine comprising an actuator comprising:
    a top plate having at least one duct opening in particular for a respective electric contact pin, onto which a contact stud carrier with a contact stud can be located, wherein the duct opening is protected on its open side against the ingress of plastic during extrusion coating,
    a sealing washer attached to the open side of the duct opening, wherein the sealing washer is embodied to cover the top side of the top plate in an overlapping manner at least in the area of the duct opening, thereby hermetically sealing the duct opening.

10. The fuel injector according to claim 9, wherein the sealing washer is embodied in the area of the duct opening with a thickening protruding at least partially into the duct opening.

11. The fuel injector according to claim 9, wherein the sealing washer can be fixed into position on the top side of the top plate and can preferably be secured there by means of an adhesive.

12. The fuel injector according to claim 9, wherein a sprung element is provided which presses the sealing washer against the open side of the duct opening.

13. The fuel injector according to claim 9, wherein an actuator length can be specified between the contact stud of the contact stud carrier and a reference edge of the actuator independently of the thickness of the sealing washer.

14. The fuel injector according to claim 9, wherein the sealing washer comprises an insulating plastic material.

15. The fuel injector according to claim 9, wherein the sealing washer is embodied at least partially from metal.

16. A method of manufacturing an actuator for a fuel injector in an internal combustion engine comprising the steps of:
    providing the actuator having a top plate and at least one duct opening for a respective electric contact pin,
    attaching a sealing washer to the open side of the duct opening, wherein the sealing washer is embodied to cover the top side of the top plate in an overlapping manner at least in the area of the duct opening, thereby hermetically sealing the duct opening,
    placing a contact stud carrier with a contact stud onto a top plate of the actuator, thereby protecting the duct opening on its open side against the ingress of plastic during extrusion coating.

17. The method according to claim 16, further comprising the step of fixing the sealing washer into position on the top side of the top plate and preferably securing the sealing washer there by means of an adhesive.

18. The method according to claim 16, further comprising the step of providing a sprung element which presses the sealing washer against the open side of the duct opening.

19. The method according to claim 16, further comprising the step of specifying an actuator length between the contact stud of the contact stud carrier and a reference edge of the actuator independently of the thickness of the sealing washer.

20. The method according to claim 16, further comprising the step of extrusion coating the actuator.

* * * * *